United States Patent [19]

Daniels

[11] 4,250,448
[45] Feb. 10, 1981

[54] VOLTMETER APPARATUS FOR CASCADED TRANSFORMERS

[75] Inventor: Michael G. Daniels, Muncie, Ind.

[73] Assignee: Westinghouse Electric Corp., Pittsburgh, Pa.

[21] Appl. No.: 10,113

[22] Filed: Feb. 7, 1979

[51] Int. Cl.³ .............................................. G01R 1/20
[52] U.S. Cl. .................................... 324/127; 323/358
[58] Field of Search .............. 324/127, 55; 323/44 R, 323/48; 363/67

[56] References Cited

PUBLICATIONS

Train et al., "Determination of Ratio ..."; IEEE Trans. on Power Apparatus and Systems; vol. PAS-95; No. 6; Nov.-Dec. 1976; pp. 1911-1918.

Jayaram et al., "Determination of Output ..."; AIEE Trans., part III; Feb. 1963; pp. 936-938.

*Primary Examiner*—Ernest F. Karlsen
*Attorney, Agent, or Firm*—D. R. Lackey

[57] ABSTRACT

A direct reading voltmeter for measuring the output voltage of the final unit of a cascade connected transformer arrangement. A voltage responsive to the output voltage of the final unit of the cascade arrangement is developed across an impedance via a current which is a summation of first and second currents responsive to the current flowing in the first unit, and the voltage applied to the first unit, respectively.

2 Claims, 1 Drawing Figure

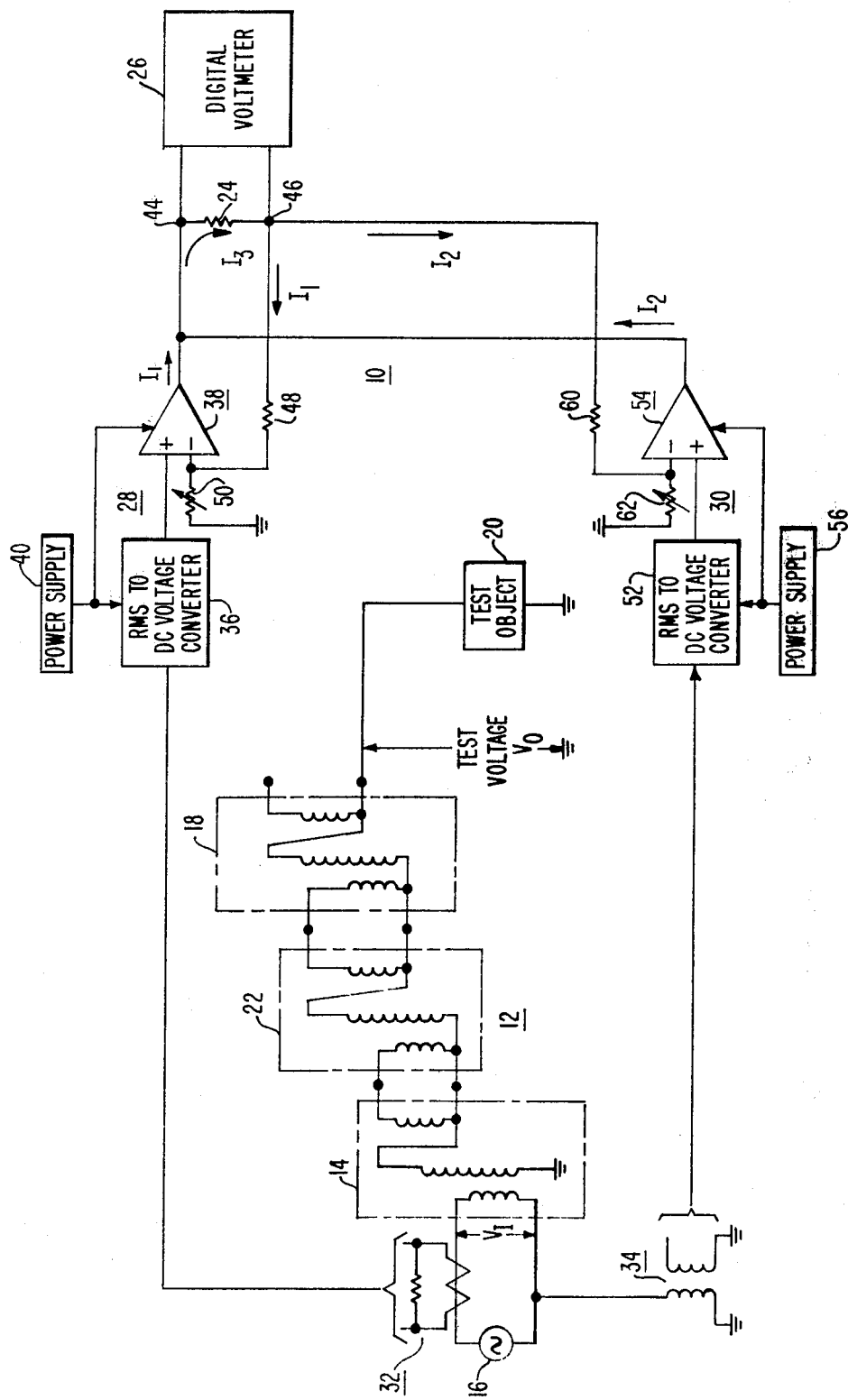

VOLTMETER APPARATUS FOR CASCADED TRANSFORMERS

BACKGROUND OF THE INVENTION

1. Field of the Invention

The invention relates in general to apparatus for making electrical measurements, and more specifically to apparatus for measuring the output voltage of cascade connected transformers.

2. Description of the Prior Art

Transformers are commonly connected in a cascade arrangement, in order to develop the high voltages necessary to test certain types of electrical apparatus, such as large condenser bushings for electrical power apparatus. Since the object to be tested is usually capacitive in nature, the actual ratio of the cascade arrangement is not the same as the nominal ratio, with the actual ratio being extremely sensitive to load capacitance. An IEEE paper by D. Train and P. Vohl entitled "Determination of Ratio Characteristics of Cascade Connected Transformers," *IEEE Transactions on Power Apparatus and Systems*, Vol. PAS-95, No. 6, November/December 1976, pages 1911–1918, describes in detail the problems involved in determining the actual ratio of cascade connected transformers, and it also discusses various techniques for measuring the voltage across the final transformer of the cascade arrangement. For example, a voltage divider arrangement may be used. Such arrangement, however, is costly. Instruments may be directly connected to the units of the cascade connection. This, however, requires that they be read by a telescope, or it requires that the intelligence be transmitted from EHV to ground potential via costly and sophisticated techniques, such as electronic, optical or acoustical techniques. The paper further describes previously known graphical techniques for ratio determination, which are based upon the measurement of the the admittance of the first unit of the cascade connection. A ratio versus input admittance curve is plotted by experimentally developing points on the curve. This is practical, because the overall ratio of output voltage to input voltage for cascade connected transformers increases linearly with an increase in input admittance, for capacitive loads. While the graphical method has many advantages over other prior art methods, it would be desirable to be able to directly indicate the voltage across the final unit of the cascade connection, if this can be accomplished without offsetting disadvantages, such as the connection of a voltage divider across the final unit, the use of telescopes, or costly, sophisticated arrangements for transmitting intelligence from a high potential to ground potential.

SUMMARY OF THE INVENTION

Briefly, the present invention is new and improved voltmeter apparatus for indicating the voltage across the final unit of a cascade transformer arrangement. The indication provided by the present invention is direct reading in that it is developed on an indicating instrument. However, no direct connections are made, or required, to the final unit of the cascade connection. Specifically, the apparatus develops first and second current signals responsive to the current flowing in the first unit, and the input voltage applied to the first unit, respectively, with each of the first and second currents being scaled by first and second predetermined constants, respectively. The first and second constants do not change, once established for a specific cascade transformer arrangement. The first and second currents are summed to provide a third current, and the voltage drop provided by this third current across an impedance is measured by an indicating instrument. The impedance is selected such that the indicating instrument reads directly in kV.

BRIEF DESCRIPTION OF THE DRAWING

The invention may be better understood, and further advantages and uses thereof more readily apparent, when considered in view of the following detailed description of exemplary embodiments, in which the single FIGURE is a schematic diagram of voltmeter apparatus constructed according to the teachings of the invention.

DESCRIPTION OF THE PREFERRED EMBODIMENT

Referring now to the drawing, the single FIGURE is a schematic diagram of new and improved voltmeter apparatus 10 constructed according to the teachings of the invention, for directly indicating the voltage across the output unit of a cascade arrangement 12. The cascade arrangement 12 includes a plurality of transformers connected in cascade, including an input unit 14 which is connected to a source 16 of alternating potential, an output unit 18 which provides an elevated test voltage for a test object 20, such as a condenser bushing, and one or more intermediate units, such as unit 22. The stray and self-capacitances of the transformer units 14, 22, 18 and the load capacitance, all influence the actual ratio of the specific cascade arrangement utilized. The cascade arrangement shown in the FIGURE is for illustrative purposes only, as many different arrangements may be used, depending upon the voltage and current requirements of the object to be tested.

The present invention develops a voltage across an impedance 24, such as the resistor illustrated, which voltage is directly proportional to the voltage of the output unit 18. The voltage drop across resistor 24 may be indicated by any suitable indicating device 26, such as the digital voltmeter indicated, or an analog voltmeter.

The current flow $I_3$ through resistor 24 is developed by first and second separate and isolated current sources 28, 30 which provide currents $I_1$ and $I_2$, respectively, with current $I_3$ being the sum of currents $I_1$ and $I_2$.

The current magnitude provided by the first current source 28 is responsive to the current flowing in the input unit 14 via a current transformer arrangement 32 which has an overall ratio of $R_{CT}$. Current transformer arrangement 32 provides a voltage signal responsive to the magnitude of the current flowing in the input unit 14, and the first current source 28 scales this signal according to a first predetermined constant $K_1$. The gain of the first current source 28 is set to provide the desired scaling factor $K_1$.

The current magnitude provided by the second current source is responsive to the voltage supplied to the input unit 14 via a potential transformer arrangement 34 which has an overall ratio $R_{PT}$. Potential transformer arrangement 34 provides a voltage signal responsive to the input voltage of the cascade arrangement 12, and the second current source 30 scales this signal by a second predetermined constant $K_2$. The gain of the second current source is set to provide the desired scaling factor $K_2$.

The scaling factors $K_1$ and $K_2$ are responsive to the ratios $R_{CT}$ and $R_{PT}$, to the nominal ratio $R_N$ of the cascade arrangement, and to the slope "a" and the y-axis intercept "b" of the actual ratio versus input admittance curve for the specific cascade arrangement 12 being measured. The slope "a" and the "y" intercept "b" may be determined experimentally by measuring different loads to establish points on the actual ratio versus input admittance curve, or through calculations using equivalent circuits, as described in the hereinbefore-mentioned IEEE paper.

More specifically, the scaling constants $K_1$ and $K_2$ are developed in the following manner. The actual ratio RT of the output voltage $V_O$ of the cascade arrangement 12 to the input voltage $V_I$, varies linearly with the input admittance $\lambda$. This relationship is described by the equation:

$$RT = a + b \quad (1)$$

where "a" is the slope of the curve and "b" is the Y-axis intercept.

The actual ratio RT may also be written in terms of the input voltage $V_I$, the output voltage $V_O$, and the nominal ratio $V_N$ of the cascade arrangement, as follows:

$$RT = V_O/(V_I \cdot V_N) \quad (2)$$

Since the input voltage $V_I$ is equal to the output voltage $V_{PT}$ of the potential transformer arrangement 34 multiplied by the ratio $R_{PT}$ of the potential transformer arrangement 34, equation (2) may also be written:

$$RT = V_O/(V_{PT} \cdot R_{PT} \cdot V_N) \quad (3)$$

If we let $K_A = 1/(R_{PT} \cdot V_N)$, equation (3) may be written:

$$RT = V_O K_A/V_{PT} \quad (4)$$

The input admittance $\lambda$ is equal to the ratio of the input current to the input voltage of the first or input unit 14 of the cascade arrangement 12. The input current $I_I$ is equal to the output current $I_{CT}$ of the current transformer arrangement 32 multiplied by the current transformer ratio $R_{CT}$, and the input voltage $V_I$ is equal to the output voltage $V_{PT}$ of the potential transformer arrangement 34 multiplied by the potential transformer ratio $R_{PT}$, and thus the input admittance may be written:

$$\lambda = I_I/V_I = (I_{CT} \cdot R_{CT})/(V_{PT} \cdot R_{PT}) \quad (5)$$

If we let $K_B = R_{CT}/R_{PT}$, then equation (5) may be written:

$$\lambda = (I_{CT} \cdot K_B)/V_{PT} \quad (6)$$

Equation (1) may now be written, using Equations (4) and (6) as follows:

$$(V_O \cdot K_A)/V_{PT} = a \cdot (I_{CT}/V_{PT}) \cdot K_B + b \quad (7)$$

Multiplying Equation (7) by $V_{PT}/K_A$, we obtain:

$$V_O = a \cdot I_{CT}(K_B/K_A) + (b \cdot V_{PT})/K_A \quad (8)$$

If we let $K_1 = ($ $a \cdot K_B)/K_A$, and $K = b/K_A$, equation (8) may be written as follows:

$$V_O = I_{CT} \cdot K_1 + V_{PT} \cdot K_2 \quad (9)$$

Thus, by examining Equation (9), it will be observed that the output voltage $V_O$ of the output unit 18 is equal to the sum of a factor responsive to the input current, and a factor responsive to the input voltage, with the two factors being scaled by constants $K_1$ and $K_2$, respectively.

The first current source 28 of the FIGURE provides the first factor $I_{CT} \cdot K_1$, and the second current source 30 provides the second factor $V_{PT} \cdot K_2$.

Since:

$$K_1 = a K_B/K_A = a R_{CT}/R_{PT}^2 \cdot V_N \quad (10)$$

$K_1$ may be calculated by determining the slope "a" experimentally, or by calculations, as hereinbefore stated.

Since:

$$K_2 = b/K_A = b/(R_{PT} \cdot V_N) \quad (11)$$

$K_2$ may be calculated by determining the y-axis intercept "b" experimentally, or by calculations.

Returning now to the FIGURE, the first current source 28 may be constructed by changing the output voltage from the current transformer arrangement 32 to a DC voltage in an RMS to DC voltage converter 36, such as Burr Brown's 4123, and by a DC voltage to DC current converter 38, such as Burr Brown's OpAMP 3269/14 operated in a voltage to current conversion mode. A power supply 40 provides the required +15 and 15 volt sources for the RMS to DC voltage converter 36 and the voltage to current converter 38. The output of the converter 36 is connected to the non-inverting input of OpAMP 38, the output of OpAMP 38 is connected to one side of resistor 24 at terminal 44, and the other side of resistor 24, at terminal 46, is connected to the inverting input via a resistor 48. The inverting input is also connected to ground potential via an adjustable resistor 50. Resistors 48 and 50 are selected, and resistor 50 adjusted, to provide the gain required by the scaling factor $K_1$.

The second current source 30 may be constructed by changing the output voltage from the potential transformer arrangement 34 to a DC voltage in an RMS to DC voltage converter 52, such as Burr Brown's 4123, and by a DC voltage to D.C. current converter 54, such as Burr Brown's OpAMP 3269/14 operated in a voltage to current conversion mode. A power supply 56 provides the required voltage sources for the RMS to D.C. voltage converter 52 and the voltage to current converter 54. Power supply 56 is isolated from power supply 40. The output of converter 52 is connected to the non-inverting input of OpAMP 54, the output of OpAMP 54 is connected to one side of resistor 24 at terminal 44, and the other side of resistor 24, at terminal 46, is connected to the inverting input via a resistor 60. The inverting input is also connected to ground potential via an adjustable resistor 62. Resistors 60 and 62 are selected, and resistor 62 adjusted to provide the gain required by the scaling factor $K_2$.

The digital voltmeter 26 is connected to terminals 44 and 46, and it thus indicates the voltage drop across resistor 24, which is responsive to the sum of the two scaled currents $I_1$ and $I_2$ from current sources 28 and 30, respectively. Currents $I_1$ and $I_2$ are summed to provide a current $I_3$ which provides a voltage drop across resistor 24 responsive to the output voltage $V_O$ of the output unit 18. The value of resistor 24 is selected such that it provides a voltage which is a multiple of a power of 10 of the actual voltage, e.g., a 3.5 volt drop across resistor 24 will indicate a voltage of 350 kV.

In summary, there has been disclosed new and improved voltmeter apparatus which enables the voltage across the output unit of a plurality of transformers connected in cascade to be directly indicated on an indicating instrument, making it unnecessary to use graphs, telescopes, voltage dividers, or costly high voltage to ground transducer arrangements.

I claim as my invention:

1. Voltmeter apparatus for measuring the output voltage of a cascade connected transformer having an input unit adapted for connection to a source of alternating potential, an output unit adapted for connection to a load circuit, a nominal ratio $V_N$ and an actual ratio RT defined by the linear equation $RT = a\lambda + b$, wherein "a" is the slope, "b" is the y-axis intercept, and $\lambda$ is the admittance of the input unit, comprising:

first means including current transformer means having a predetermined ratio $R_{CT}$, said first means providing a first unidirectional current responsive to the current flowing in the input unit scaled by a first predetermined constant;

second means including potential transformer means having a predetermined ratio $R_{PT}$, said second means providing a second unidirectional current responsive to the voltage applied to the input unit scaled by a second predetermined constant;

said first predetermined constant being equal to $aR_{CT}/(R_{PT}^2 \cdot V_N)$;

said second predetermined constant being equal to $(b/R_{PT} \cdot V_N)$;

impedance means providing a voltage drop responsive to the sum of said first and second currents;

and indicating means providing an indication of the magnitude of the voltage drop across said impedance means, wherein the magnitude of said voltage drop is responsive to the voltage across the output unit of the cascade connected transformers.

2. The voltmeter apparatus of claim 1 wherein the magnitude of the impedance means is selected such that the voltage drop across the impedance means is related to the actual voltage of the output unit by a predetermined power of 10.

* * * * *